United States Patent [19]

Kumar et al.

[11] Patent Number: 5,118,385
[45] Date of Patent: Jun. 2, 1992

[54] MULTILAYER ELECTRICAL INTERCONNECT FABRICATION WITH FEW PROCESS STEPS

[75] Inventors: Nalin Kumar, Austin; Charles W. C. Lin, San Antonio, both of Tex.

[73] Assignee: Microelectronics and Computer Technology Corporation, Austin, Tex.

[21] Appl. No.: 705,843

[22] Filed: May 28, 1991

[51] Int. Cl.⁵ .................... B44C 1/22; C23F 1/00; B29C 37/00
[52] U.S. Cl. .................... 156/644; 156/645; 156/652; 156/655; 156/656; 156/659.1; 156/668; 156/902
[58] Field of Search ............ 427/98, 97, 304; 204/15, 38.1, 38.4, 40; 156/644, 645, 650, 652, 655, 656, 659.1, 664, 666, 901, 668, 902; 430/313, 317, 318; 29/846, 848, 852, 874, 883, 884

[56] References Cited

U.S. PATENT DOCUMENTS

| | | | |
|---|---|---|---|
| 4,670,091 | 6/1987 | Thomas et al. | 156/656 X |
| 4,702,792 | 10/1987 | Chow et al. | 156/628 |
| 4,810,332 | 3/1989 | Pan | 204/15 |
| 4,983,250 | 1/1991 | Pan | 156/668 X |
| 5,011,580 | 4/1991 | Pan et al. | 204/15 |
| 5,071,518 | 12/1991 | Pan | 205/184 |
| 5,082,718 | 1/1992 | Chantraine et al. | 156/668 X |

OTHER PUBLICATIONS

Tessier et al, "Process Condiserations in Fabricating Thin Film Multichip Modules," International Electronics Packaging Society Conference Proceedings, 1989, pp. 294-313.

Endo et al, "Material and Pressing Technologies of Polyimide for Advanced Electronic Devices," Journal of the Electrochemical Society, vol. 134, No. 10 (Oct. 1987), pp. 2522-2527.

Primary Examiner—William A. Powell
Attorney, Agent, or Firm—David M. Sigmond

[57] ABSTRACT

Method for making a multilayer electrical interconnect with stacked pillars between layers using a minimal number of conventional process steps. The method includes sputtering a chromium/copper/titanium trilayer on a dielectric base, depositing a patterned mask on the trilayer, etching the exposed trilayer, removing the mask, depositing a layer of polyimide over the unetched copper, forming a via in the polyimide above the copper, electrolessly plating nickel into the via, and polishing the interconnect to form a planar top surface.

23 Claims, 2 Drawing Sheets

MULTILAYER ELECTRICAL INTERCONNECT FABRICATION WITH FEW PROCESS STEPS

BACKGROUND OF THE INVENTION

Current multi-chip circuitry design requires the attachment of numerous integrated circuit chips to high density multi-layer interconnect (HDMI) substrates (or boards) for multi-chip-modules (MCM). The electrical interconnects normally include surface pads for bonding to surface mounted chips, a dielectric, and electrical lines buried in the dielectric for connecting selected pads to provide electrical routing between various bond sites on the chips. It is common to use copper for the buried lines and polyimide as the dielectric. The copper lines may form separate layers of orthogonal wiring sets that are interconnected to the surface pads by vertical metal pillars.

Obviously cost is an important factor in any substrate fabrication approach. The cost tends to be closely associated with the number of fabrication steps. Normally, additional steps not only increase the labor and material costs as well as the process complexity, but also decrease yields. Thus a mature substrate fabrication process which reduces the number of fabrication steps to produce an equivalent structure will typically reduce costs and improve yields.

SUMMARY

An object of the present invention is to provide a method for making a multilayer electrical interconnect with stacked pillars between layers using a minimal number of conventional process steps.

Another object of the present invention is a method for making a multilayer electrical interconnect using conventional additive and subtractive process steps in which the number of process steps is less than that required by prior art approaches.

A feature of the present invention is a fabrication method including depositing a layer of an electrically conductive first metal on a base, depositing a mask on the first metal wherein the mask has an opening above a portion of the first metal, etching the portion of the first metal thereby leaving unetched first metal on the base, removing the mask, depositing a layer of dielectric over the unetched first metal, forming a via in the dielectric above a region of the unetched first metal, depositing an electrically conductive second metal into the via wherein the second metal fills the via with a metal pillar in electrical contact with the unetched first metal, and planarizing the top of the interconnect.

Advantages of the present invention include process simplification, reduced labor and material costs, improved throughput, and increased yields due to the minimal number of well-known fabrication steps.

These and other objects, features and advantages of the present invention will be more readily apparent from a review of the detailed description and preferred embodiments which follow.

DETAILED DESCRIPTION OF THE PREFERRED EMBODIMENTS

Figure 1:
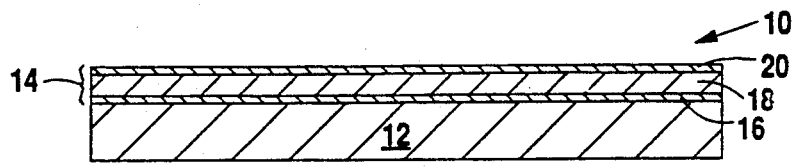
FIGS. 1-9 are fragmentary elevational views in cross-section illustrating successive stages for fabricating a multilayer electrical interconnect in accordance with the present invention.

Referring now to the drawings and particularly to FIG. 1, the reference numeral 10 generally indicates a multilayer electrical interconnect to be used for connecting I/O pads of integrated circuit chips to eventually be surface mounted thereon. Substrate 10 includes a base such as a smooth polymer layer of polyimide 12. As shown, an electrically conductive first metal layer 14 is deposited on polyimide 12 by evaporating a 500 angstrom layer of chromium 16 on polyimide 12, a 5 micron layer of copper 18 on chromium 16, and a 500 angstrom layer of titanium 20 on copper 18. Copper 18 serves as the bulk of the first electrically conductive metal 14. Chromium 16 provides adhesion between copper 18 and polyimide 12, and titanium 20 protects copper 18 from oxidation and corrosion. Either chromium or titanium can be used for the adhesive and/or protective layer.

Figure 2:
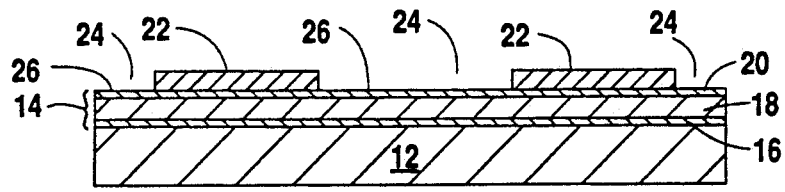

Referring now to FIG. 2, a mask is deposited on the first metal. A 1.5 micron photoresist etch mask 22 is deposited on titanium 20 and is then patterned by standard lithographic techniques to form openings 24 above portions 26 of first metal 14.

Figure 3:
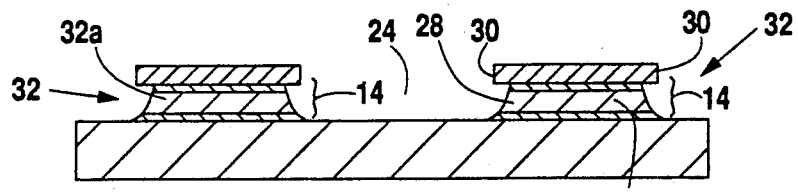

With reference now to FIG. 3, the uncovered portions of titanium 20, copper 18 and chromium 16 are wet etched in appropriate etchant solutions this etches and removes uncovered portions 26 of first Metal 14 (layers 20, 18 and 16). In addition, undercutting by the etchant solutions may remove a small curved portion 28 of first metal 14 which extends beneath edges 30 of the mask at openings 24. However, the absence of first metal portion 28 will not have a significant effect on the performance of the completed electrical interconnect. Unfortunately, wet etching is typically isotropic; a anisotropic wet etch may be quite difficult depending on the signal line pitch, mask aspect ratio and other factors. Nonetheless, unetched horizontal copper lines 32 seen as circuits 32a and 32b remain on and continue to adhere well to polyimide 12.

Figure 4:
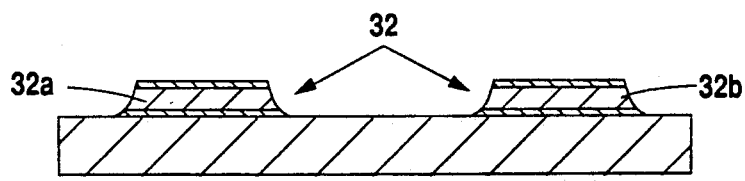

Referring now to FIG. 4 photoresist 22 is removed by stripping as is conventional. Alternatively, if desired, the wet etch of chromium 16 outside unetched copper 32 can be performed after stripping mask 22.

There are, of course, other methods for depositing patterned conductors on a substrate. The approach in FIGS. 1-4 may be considered a "wet etch" approach. Wet etching advantageously overcomes the height uniformity problems of electroplating as well as the isotropic deposition problems of electroless plating. However, the tendency of wet etching to etch isotropically may prevent high resolution applications. Nevertheless, the present invention is directed soley to a sequence of process steps which include the wet etch approach.

Figure 5:
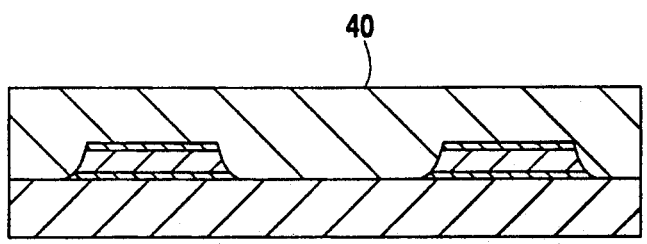

With reference now to FIG. 5, an inter-layer dielectric and preferably a polymer is coated over first metal 14. For illustration purposes, a layer of photosensitive polyimide 40 is spin coated over electrical interconnect 10 as is conventional. The use of photoimagible polyimide as an electrical interconnect dielectric is conventional, see, for instance, K.K. Chakrovorty et al., "Photosensitive Polyimide as a Dielectric in High Density Thin Film Copper-Polyimide Interconnect Structures," *The Electrochemical Society Extended Abstracts*, Vol. 88-1, Abstract No. 54, pp. 77-78 (May, 1988). A disadvantage which may arise is that the copper sides of the circuits 32 are exposed to polyimide and limited interdiffusion of copper into polyimide may take place. Nonetheless, this should not result in a catastrophic failure such as line delamination. Furthermore, copper interdiffusion can be avoided by applying a protective overcoat, such as electrolessly plated nickel or immersion coated tin, over the copper sides.

Figure 6:
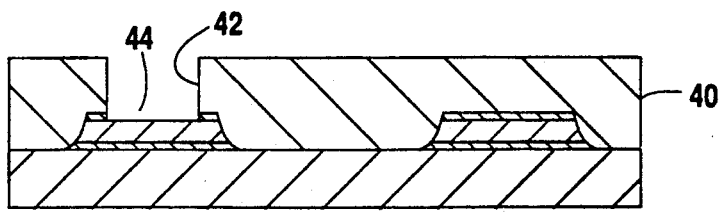

Referring now to FIG. 6, a via is formed in the dielectric to expose the first metal. As may be seen, vertical via 42 is formed in photosensitive polyimide 40 using standard photolithography to expose underlaying region 44 of titanium 20. Needless to say, via 42 may be formed by other conventional techniques such as photoablation. While at least one via must be formed above one unetched copper line 32, it is not mandatory or even necessarily desirable that a via be formed above each copper line. For illustration purposes a via 42 is formed above unetched copper 32a but not unetched copper 32b. At this point, it polyimide 40 has only been soft baked then the polyimide needs to be fully cured, and any protective titanium 20 over copper 32a is etched and removed.

Figure 7:
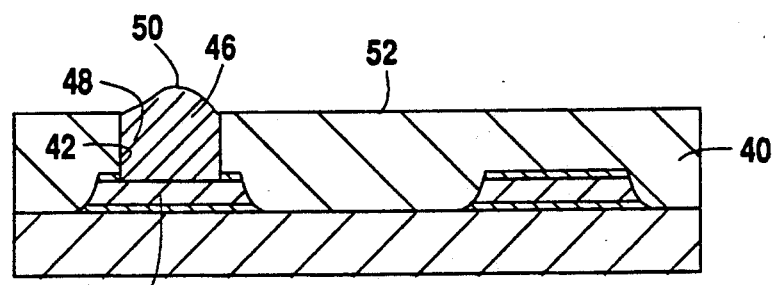

With reference now to FIG. 7, an interlayer via is filled with a second electrically conductive metal (i.e. via-fill). Chemical vapor deposition is preferred, electroless deposition is most preferred. As may be seen, nickel 46 is electrolessly deposited into via 42. This fills via 42 with a nickel pillar 48 in electrical contact with first metal circuit 32a. In addition to pure nickel, numerous nickel alloys including nickel-phosphor and nickel-boron, as well as other electrically conductive metals such as copper, tungsten, gold, silver, and palladium can be used to form metal pillars in the vias. The conventional electroless nickel plating process leaves the "mushroom" top 50 of nickel pillar 48 protruding above the top surface 52 of polyimide 40. Such electroless mushrooms may be avoided as described in U.S. Ser. No. 07/217,767, filed June 19, 1991 (pending), entitled "Detecting Completion of Electroless Via Fill."

Figure 8:
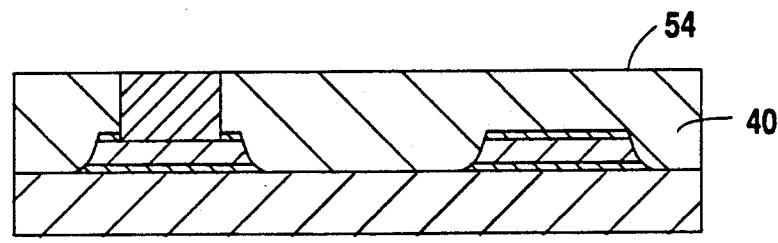

Referring now to FIG. 8, the top 54 of electrical interconnect 10 is planarized as is typically required before the fabrication of additional layers thereon. Planarization is preferably accomplished by polishing, most preferably mechanical polishing, although mechanical/chemical polishing and wet etching are also suitable. Wet etching may be preferred if top 54 is relatively smooth.

Figure 9:
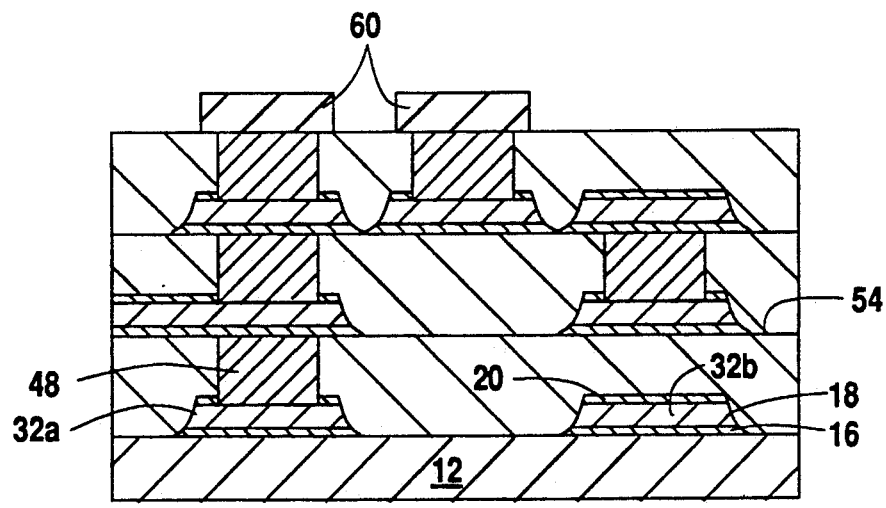

With reference now to FIG. 9, a multilayer electrical interconnect can be fabricated by repeating the forementioned process steps in FIGS. 1-8. Furthermore, surface bonding pads or bumps 60 can added to protrude above the metal pillars in the top layer. Bumps 60 can later be connected by tape-automated-bonding (TAB) leads to I/0 pads of surface mounted integrated circuit chips (not shown). The exact configuration of the vias, pillars, and buried metal lines is a matter of design choice. The preferred wiring configuration is a customizable high density copper/polyimide substrate as described in European Patent Application 88308996.3 by Carey.

The present invention is therefore well adapted to carry out the objects and attain the ends and advantages mentioned, as well as others inherent therein. While presently preferred embodiments of the invention have been described for the purpose of disclosure, numerous other changes in the details of construction and arrangement of parts may be made without departing from the spirit of the present invention and the scope of the appended claims.

What is claimed is:

1. A method of making a multilayer electrical interconnect, comprising the following steps in the sequence set forth:

depositing an adhesion layer on a planar base;

depositing a layer of an electrically conductive first metal on the adhesion layer;

depositing a mask on the first metal, the mask comprising an opening above a portion of the first metal;

wet etching said portion of the first metal and the underlaying adhesion layer, and removing the mask, thereby leaving unetched first metal on the base;

depositing a layer of dielectric over the unetched first metal;

forming a via in the dielectric above the unetched first metal;

depositing an electrically conductive second metal into the via, wherein the second metal fills the via with a metal pillar in electrical contact with the unetched first metal; and planarizing the top surface of the interconnect.

2. The method of claim 1 wherein the first metal is copper.

3. The method of claim 2 wherein the adhesion layer is titanium or chromium.

4. The method of claim 3, further comprising depositing a protective layer of titanium or chromium over the copper layer before depositing the mask.

5. The method of claim 4 wherein the mask is photoresist.

6. The method of claim 1 wherein the adhesion layer is etched before removing the mask.

7. The method of claim 1 wherein the adhesion layer is etched after removing the mask.

8. The method of claim 1 wherein first metal under the edges of the opening in the mask is also etched as said portion of the first metal is etched.

9. The method of claim 1 wherein the dielectric is a polymer.

10. The method of claim 1, wherein the steps of depositing a layer of dielectric over the unetched first metal and forming a via in the dielectric above the unetched first metal include depositing an uncured polymer on the first metal, forming the via in the uncured polymer, and curing the polymer.

11. The method of claim 1 wherein the second metal is deposited by electroless plating.

12. The method of claim 1 wherein the second metal is deposited by chemical vapor deposition.

13. The method of claim 1 wherein the second metal is selected from the group consisting of copper, nickel, nickel-alloys, gold, silver, palladium and tungsten.

14. The method of claim 1 wherein the second metal comprises nickel or copper.

15. The method of claim 1 wherein the planarizing is accomplished by polishing.

16. A method of making a multilayer electrical interconnect, comprising the following steps in the sequence set forth:

providing a dielectric;

depositing an adhesion layer of titanium or chromium on the dielectric;

depositing a layer of copper on the adhesion layer;

depositing a photoresist mask over the copper, wherein the photoresist mask has an opening which exposes a portion of the copper;

wet etching the exposed copper and underlaying adhesion metal, and stripping the photoresist mask, thereby leaving an unetched horizontal copper line adhering to the dielectric;

depositing a layer of polymer over the unetched copper;

forming a vertical via in the polymer above the unetched copper;

depositing a pillar metal comprising copper or nickel into the via so that the pillar metal fills the via and electrically contacts the unetched copper; and polishing the top of the interconnect to form a planar top surface.

17. The method of claim 16 wherein the polymer is polyimide.

18. The method of claim 17 wherein the polymer is photosensitive polyimide.

19. The method of claim 16 wherein the pillar metal contains nickel and is electrolessly deposited.

20. A method of making a multilayer electrical interconnect, comprising the following steps in the sequence set forth:

providing a dielectric base;

depositing an adhesion metal of chromium or titanium on the dielectric base;

depositing a copper on the adhesion metal;

depositing a protective metal of chromium or titanium on the copper;

depositing photoresist on the protective metal;

forming a plurality of openings by photo-lithography in the photoresist above the protective metal;

applying a wet chemical etch to remove the protective metal, copper and adhesive metal beneath the photoresist openings;

stripping the photoresist from the interconnect;

depositing a layer of polyimide over the unetched protective metal, copper and adhesion metal;

forming a plurality of vertical vias in the polyimide, wherein each via is positioned above the unetched copper;

applying a second etch to remove the protective metal between the vias and the unetched copper;

depositing by one of electroless deposition or chemical vapor deposition a pillar metal which contains copper or nickel into the vias so that each via is filled with a metal pillar in electrical contact with underlaying unetched copper; and polishing the interconnect to form a planar top surface.

21. The method of claim 20 wherein the adhesion metal, protective metal, and copper therebetween are deposited by sputtering.

22. The method of claim 20 wherein the polyimide is deposited by spin coating.

23. The method of claim 20 wherein the polishing is mechanical polishing.

* * * * *

UNITED STATES PATENT AND TRADEMARK OFFICE
CERTIFICATE OF CORRECTION

PATENT NO. : 5,118,385
DATED : June 2, 1992
INVENTOR(S) : Kumar, et al

It is certified that error appears in the above-indentified patent and that said Letters Patent is hereby corrected as shown below:

Column 2, line 28, insert a -- . -- after "solutions".

Column 2, line 28, change "this" to -- This --.

Column 2, line 29, change "Metal" to -- metal --.

Column 2, line 36, change "a" to -- an --.

Column 3, line 24, change "," to -- ; --.

Column 3, line 37, change "217,767" to -- 717,767 --.

Column 3, line 50, insert -- be -- before "added".

Column 4, line 46, change "include" to -- include: --.

Column 5, line 31, insert -- layer -- after "copper".

Signed and Sealed this

Third Day of August, 1993

Attest:

MICHAEL K. KIRK

Attesting Officer

Acting Commissioner of Patents and Trademarks